United States Patent
Liu et al.

(10) Patent No.: US 6,284,642 B1
(45) Date of Patent: Sep. 4, 2001

(54) INTEGRATED METHOD OF DAMASCENE AND BORDERLESS VIA PROCESS

(75) Inventors: Meng-Chang Liu, Chia-yi; Chao-Bao Cheng; Kuo-Chin Hsu, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/372,077

(22) Filed: Aug. 11, 1999

(51) Int. Cl.⁷ ................................................ H01L 21/4763
(52) U.S. Cl. .................... 438/622; 438/637; 438/638; 438/634
(58) Field of Search ................................ 438/638, 637, 438/640, 618, 624, 634, 639, 625

(56) References Cited

U.S. PATENT DOCUMENTS

| | | | |
|---|---|---|---|
| 4,789,648 | 12/1988 | Chow et al. | 437/225 |
| 5,229,257 | 7/1993 | Cronin et al. | 430/315 |
| 5,598,027 | 1/1997 | Matsuura | 257/635 |
| 5,801,094 | 9/1998 | Yew et al. | 438/624 |
| 6,156,643 * | 12/2000 | Chan et al. | 438/638 |
| 6,159,661 * | 12/2000 | Huang et al. | 430/313 |
| 6,171,951 * | 1/2001 | Lee et al. | 438/637 |

* cited by examiner

Primary Examiner—Michael Trinh
(74) Attorney, Agent, or Firm—George O. Saile; Stephen B. Ackerman

(57) ABSTRACT

A new process is provided to create openings and interconnect patterns for the dual damascene structure. Four layers of dielectric are sequentially deposited over a pattern of interconnect metal. The via hole pattern is defined, the interconnect line pattern is next defined. The via pattern is etched though the upper layer of dielectric and through the stop layer. Only one etch processing step is used to create the desired vias and the desired interconnect line pattern. After the interconnect patterns and vias have been created in the four layers of dielectric, a barrier layer is blanket deposited, the metal is deposited for the dual damascene structure and the interconnect line pattern and polished.

28 Claims, 2 Drawing Sheets

INTEGRATED METHOD OF DAMASCENE AND BORDERLESS VIA PROCESS

BACKGROUND OF THE INVENTION (1) Field of the Invention

The invention relates to the fabrication of integrated circuit devices, and more particularly, to a method for forming one or more levels of damascene structures whereby (via and contact) holes are formed at the same time that (interconnect) wire lines are formed.

(2) Description of the Prior Art

In the formation of semiconductor integrated circuits, it is common practice to form interconnect metal line structures on a number of different levels within the structure and interconnecting the various levels of wiring with contact or via openings. The first or lowest level of interconnect wires is typically formed as a first step in the process after which a second or overlying level of interconnect wires is deposited over the first level. The first level of interconnect wires is typically in contact with active regions in a semiconductor substrate but is not limited to such contact. The first level of interconnect can for instance also be in contact with a conductor that leads to other devices that form part of a larger, multi-chip structure. The two levels of metal wires are connected by openings between the two layers that are filled with metal where the openings between the two layers line up with and match contact points in one or both of the levels of metal lines.

Previously used techniques to form multi-levels of wiring apply the technique of first forming the interconnect level metal in a first plane followed by forming the overlying level of interconnect wire in a second plane. This structure typically starts with the surface of a semiconductor substrate into which active devices have been created. These active devices can include bipolar transistors, MOSFET devices, doped regions that interconnect with other regions of the device while provisions may also have been provided to make interconnects with I//O terminals in the periphery of the device. The surface into which the pattern of interconnect lines of the first plane is formed may also be an insulation layer deposited over the surface of the substrate or a layer of oxide may first have been formed on the surface of the substrate. After the layer, into which the pattern of interconnecting wires has to be created, has been defined, the interconnecting pattern itself needs to be defined. This is done using conventional photolithographic techniques whereby the openings are made (in the layer) above the points that need to be contacted in the substrate. The openings, once created, may by lined with layers of material to enhance metal adhesion (to the sidewalls of the opening), the glue or seed layer, or to prevent diffusion of materials into and from the damascene structure in subsequent processing steps, the barrier layer. For the barrier layer, a variety of materials can be used such as Ti/TiN:W (titanium/ titanium nitride:tungsten), titanium-tungsten/titanium or titanium-tungsten nitride/titanium or titanium nitride or titanium nitride/titanium, tungsten, tantalum or its compounds, niobium, molybdenum. The final phase in creating the first level of interconnect lines is to fill the created openings with metal, typically aluminum, tungsten or copper, dependent on the particular application and requirements and restrictions imposed by such parameters as line width, aspect ratio of the opening, required planarity of the surface of the deposited metal and others.

This process of line formation in overlying layers of metal can be repeated in essentially the same manner as just highlighted for the first layer of interconnecting wires. This process of forming sequential layers of interconnecting levels of wire is in many instances prone to problems and limitations. The use of copper has in recent times found more application in the use of metal wires due to its low resistivity, high electromigration resistance and stress voiding resistance. Copper however exhibits the disadvantage of high diffusivity in common insulating materials such as silicon oxide and oxygen-containing polymers. This leads to, for instance, the diffusion of copper into polyimide during high temperature processing of the polyimide resulting in severe corrosion of the copper and the polyimide due to the copper combining with oxygen in the polyimide. The corrosion may result in loss of adhesion, delamination, voids, and ultimately a catastrophic failure of the component. A copper diffusion barrier is therefore often required. Furthermore, due to the fact that copper is very difficult to process by RIE, the CMP method may need to be used where copper is used as a wiring material. To polish copper at a high rate without scratching in accordance with the buried wiring formation, the copper etch rate must be raised by increasing the amount of the component responsible for copper etching contained in the polishing slurry. If the component is used in an increased amount, the etching will occur isotropically. Consequently, buried copper is etched away, causing dishing in the wiring. It is, when forming interconnect lines using copper, desirable to use methods that do not depend on patterning the copper lines using a chemical etching process since etching of copper is very difficult and is a process that is only recently being further investigated. The use of copper as a metal for interconnect wiring is further hindered by copper's susceptibility to oxidation. Conventional photoresist processing cannot be used when the copper is to be patterned into various wire shapes because the photoresist needs to be removed at the end of the process by heating it in a highly oxidized environment, such as an oxygen plasma, thereby converting it to an easily removed ash.

Further problems of forming multi-layers of interconnect lines using the methods indicated above result from the continuing trend of micro-miniaturization in the semiconductor industry. This trend leads to ever decreasing device features and with that, decreasing line width. To deposit metals into these narrow lines is a difficult process where problems of proper line profiling, voids in the deposited metal and the trapping of impurities lead to serious restraints on the manufacturing process. Where a larger number of interconnecting lines are required, the number of processing steps required to create these lines may also become excessive thereby increasing processing steps and creating potentially serious yield detractors. It is therefore desirable to use processes that combine some of the above indicated steps and create for instance via openings at the same time as or in combination with the creation of the interconnect wire pattern.

Two widely used approaches in creating metal interconnects is the use of the damascene and the dual damascene structures. The application of the Damascene process continues to gain wider acceptance, most notably in the process of copper metalization due to the difficulty of copper dry etch where the Damascene plug penetrates deep in very small, sub-half micron, Ultra Large Scale Integrated devices. Recent applications have successfully used copper as a conducting metal line, most notably in the construct of CMOS 6-layer copper metal devices.

In the formation of a damascene structure, a metal plug is first formed in a surface; this surface in most instances is the surface of a semiconductor substrate. A layer of Intra Level Dielectric (ILD) is deposited (using for instance Plasma Enhanced CVD technology with $SiO_2$ as a dielectric) over the surface into which trenches for metal lines are formed (using for instance Reactive Ion Etching technology).

The trenches overlay the metal plug and are filled with metal (using for instance either the CVD or a metal flow process). Planarization of this metal to the top surface of the layer of ILD completes the damascene structure. Some early damascene structures have been achieved using Reactive Ion Etching (RIE) for the process of planarization but Chemical Mechanical Planarization (CMP) is used exclusively today.

An extension of the damascene process is the dual damascene process whereby an insulating or dielectric material, such as silicon oxide, is patterned with several thousand openings for the conductive lines and vias, which are filled at the same time with metal. Damascene is an interconnection fabrication process in which grooves are formed in an insulating layer and filled with metal to form the conductive lines. Dual damascene is a multi-level interconnection process in which, in-addition to forming the grooves of single damascene, conductive via openings also are formed. One of the dual damascene approaches uses a dielectric layer that is formed by three consecutive depositions whereby the central layer functions as an etch stop layer. This etch stop layer can be SiN, the top and bottom dielectric layer of this three layer configuration can be $SiO_2$. This triple layer dielectric allows first forming the vias by resist patterning the vias and etching through the two layers of dielectric and the central stop layer. The conductive pattern can then be formed in the top layer of dielectric whereby the central layer of SiN forms the stop layer for the etch of the conducting pattern. Another approach, still using the three-layer dielectric formed on the substrate surface, is to first form the pattern for the conducting lines in the top layer of the dielectric whereby the SiN layer again serves as etch stop. The vias can then be formed by aligning the via pattern with the pattern of the conducting lines and patterning and etching the vias through the etch stop layer of SiN and the first layer of dielectric. Yet another approach is to deposit the three layer dielectric in two steps, first depositing the first layer of $SiO_2$ and the etch stop layer of SiN. At this point the via pattern can be exposed and etched. The top layer of $SiO_2$ dielectric is then deposited; the conducting lines are now patterned and etched. The SiN layer will stop the etching except where the via openings have already been etched.

Dual damascene is an improvement over single damascene because it permits the filling of both the conductive grooves and vias with metal at the same time, thereby eliminating process steps.

Aluminum damascene structures can be fabricated using a planarized aluminum deposition process to fill sub-half micron geometry etched in oxide after which CMP is performed to remove the excess aluminum over the field region. Both single damascene, where vias only are created, and dual damascene, where vias are created and conductors are created above the vias, can be fabricated in this manner. For the dual damascene, special etch procedures can be used to form both the vias and the conductor patterns in the dielectric layer before the deposition of aluminum and the aluminum CMP. A thin etch stop layer was used for this purpose between two layers of dielectric $SiO_2$.

One of the approaches that can be used in creating a dual damascene structure is further highlighted here to show the importance that multiple stop layers interspersed with multiple layers of passivation or dielectric can have in this process. A first etch stop layer is first deposited over the surface of a substrate. A first passivation layer of, for instance SiO2, is deposited over the first etch stop layer, followed by a thin layer of SiN as second etch stop, followed by the via resist patterning and etching of the second stop layer. This is followed by depositing the top layer of dielectric, a third etch stop layer may be deposited over the surface of the second dielectric. The conductor patterning can be formed in the third etch stop layer. In etching the conductor pattern in the top dielectric layer, the etching process will be stopped by the second stop layer except where the via holes are already opened in the second stop layer thereby completing the simultaneous via hole etching in the passivation layer.

The invention addresses the process of creating a dual damascene structure with the creation of holes and interconnect wiring patterns. Etch stop layers are used during this process.

U.S. Pat. No. 5,801,094 (Yew et al.) teaches a dual damascene process that forms (dual damascene) holes (vias and contact) and wiring lines (interconnect lines) simultaneously, see FIGS. 15 to 21, claim 1. The invention uses etch stop layers 54 between the dielectric layers 52 and 58.

U.S. Pat. No. 4,789,648 (Chow) shows a method for producing co-planar multi-level metal/insulator films on a substrate and for forming patterned conductive lines simultaneously with stud vias.

U.S. Pat. No. 5,229,257 (Cronin et al.) teaches a multi-level conductor using a polyimide insulator.

U.S. Pat.No. 5,598,027 (Matsuura) shows a damascene interconnect process with etch stops.

SUMMARY OF THE INVENTION

A principle objective of the invention is to provide a process whereby vias and interconnect line patterns can be created simultaneously for the damascene process.

Another objective of the invention is to allow for the use of low resistivity metals in creating the damascene structure.

Yet another objective of the invention is to improve gap fill when narrow metal line profiles are used for the damascene structure.

A still further objective of the invention is to allow for improved control over the photolithographic and etch processing window when applied during the creation of damascene structures.

Yet another objective of the invention is to reduce the number of processing steps that are required for the damascene process.

Yet another objective of the invention is to reduce defect density of the damascene process.

In accordance with the objectives of the invention a new process is provided for the creation of openings and interconnects patterns for the damascene structure. Four layers of dielectric are sequentially deposited over a pattern of interconnect metal as follows: first layer of dielectric (the via dielectric), first stop layer, second layer of dielectric (the interconnect line dielectric) and second stop layer. The via hole pattern is defined at the second stop layer, the interconnect line pattern is next defined also in the second stop layer. A first etch is performed thereby etching the via pattern though the second layer of dielectric and through the second stop layer. The invention then takes advantage of the difference in etch speed between the successive layers of dielectric to create the desired vias and the desired interconnect line pattern by using only one etch processing step for the creation of the dual damascene structure. The invention further takes advantage of the first stop layer to control the depth of the etching of the interconnect line pattern between the interconnect line pattern and the via openings. After the interconnect pattern and vias have been created in the four layers of dielectric, a barrier layer is blanket deposited, the metal is deposited for the damascene structure and polished thereby achieving global planarization.

DESCRIPTION OF THE PREFERRED EMBODIMENTS

Figure 1:
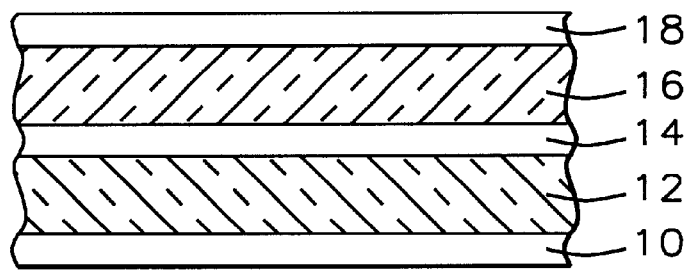
FIG. 1 shows a cross section of the deposition of two layers of dielectric with two stop layers on the surface of a substrate.

Referring now specifically to FIG. 1, there is shown a cross section of the deposition of four layers 12, 14, 16 and 18, on the surface of a substrate 10. The four layers in sequence will be referred to as the first layer of dielectric 12, the first stop layer 14, the second layer of dielectric 16 and the second stop layer 18. The difference between the successive layers that have been deposited in this manner is the relative etch selectivity or etch speed of each of the stop layers and layers of dielectric. Layers 12 and 16 contain oxide or any other suitable low-dielectric constant dielectric that has an etch selectivity that is high relative to the stop layers 14 and 18 (that contain nitride, oxygen nitride or any other suitable dielectric). The thickness of the various layers of dielectric that are indicated in FIG. 1 is design dependent. Key to the invention however is that the etch selectivity of the various layers are carefully selected.

Typical values for the thickness of the layers of dielectric shown is FIG. 1 are as follows:

Layer 12—between about 6.0 and 12 Kangstroms

Layer 14—between about 0.5 and 1.5 Kangstroms

Layer 16—between about 4.0 and 8.0 Kangstroms

Layer 18—between about 1.5 and 2.5 Kangstroms

It must again be emphasized that the invention is not limited to implementing the above-indicated values of thickness, these values are highlighted at this time as examples.

It must further be emphasized that the invention uses the deposition of four layers whereby two layers of dielectric are interspersed within these two stop layers. These four layers are deposited over the substrate in sequence, as follows: first a layer 12 of dielectric (for instance oxide), followed by a stop layer 14 (for instance SiN or SiON), followed by a layer 16 of dielectric (for instance oxide), followed by a stop layer 18 (for instance SiN or SiON). The deposition method for the deposition of the dielectric layers uses PECVD, HDPCVD of LPCVD technology.

Figure 2:
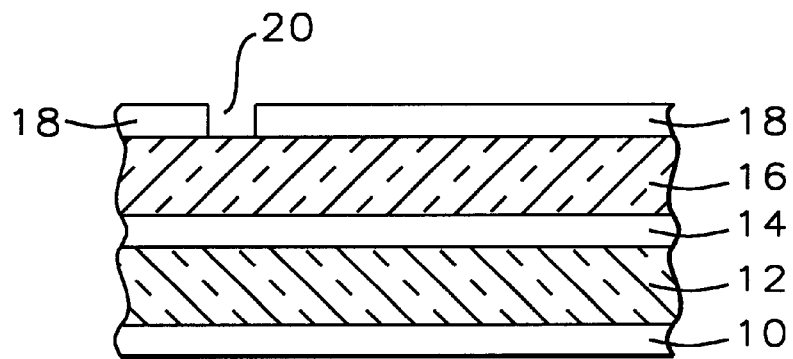
FIG. 2 shows a cross section of the deposited layers of dielectric after a via opening has been created in the upper stop layer.

FIG. 2 shows a cross section of the deposited layers after a via opening 20 has been created in the second stop layer 18. It is important to note that the width of opening 20 corresponds to the width of a via and not the width of interconnect lines. This is important because, during subsequent steps of etching, this width is carried through into the construct of the damascene structure as the width of the (underlying) via.

Figure 3:
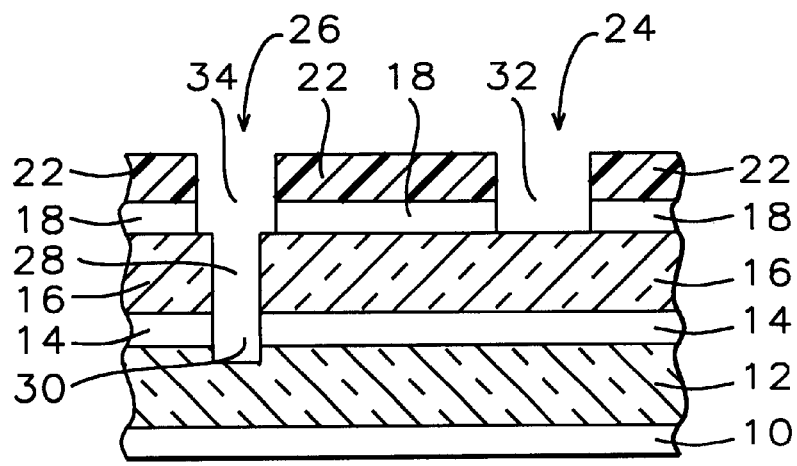
FIG. 3 shows a cross section of the deposited layers after the first etch that defines the interconnect lines pattern and etches the via pattern through the second layer of dielectric and the first stop layer.

FIG. 3 shows a cross section of the deposited layers after the interconnect line pattern has been defined and created with a first etch.

This processing step makes use of the fact that, for this first etch, the etch parameters contain $CF_4$, $CHF_3$, $O_2$, $N_2$, Ar, CO or $C_4F_8$ or any other suitable material and are chosen such that the ratio of the etch selectivity of SiN (of the second stop layer) versus oxide (of the second layer of dielectric) is about 1:6, the ratio can slightly exceed this value.

A layer 22 of photoresist is deposited over the surface of the second stop layer 18, the photoresist is patterned and etched creating openings 24 and 26 in the photoresist. It must be noted that these openings have the width of the interconnect wire pattern. After openings 24 and 26 are created (in the layer of photoresist 22) an etch is performed.

This first etch has the following results:

it removes the stop layer 18 within opening 24 from the surface of the dielectric 16 (in accordance with the width of opening 24), opening 32 is created in the second stop layer 18 above the layer 16 of dielectric it removes the second stop layer 18 within opening 26 from the surface of the dielectric 16 (in accordance with the width of opening 26)

it, due to the difference in etch rate between the second stop layer 18 and the underlying layer 16 of dielectric, penetrates (to the width of the via) through the dielectric layer 16, further penetrates through the first stop layer 14 into the upper region of layer 12 of first dielectric.

Opening 30 is thereby created, this opening 30 is in line with the original via opening 20 (FIG. 2) created in the stop layer 18. The etch that creates opening 30 can be performed such that it does not affect critical dimension (CD) control for the hole 30, especially where it concerns CD for the lower part of the opening 30.

It is to be noted that the width of the bottom of hole 30 corresponds to the via width whereby the width of the opening 34 (created in the second stop layer) corresponds to the width of the interconnecting line pattern. FIG. 3 further shows that the second stop layer 18 serves as borderless via stop layer.

Figure 4:
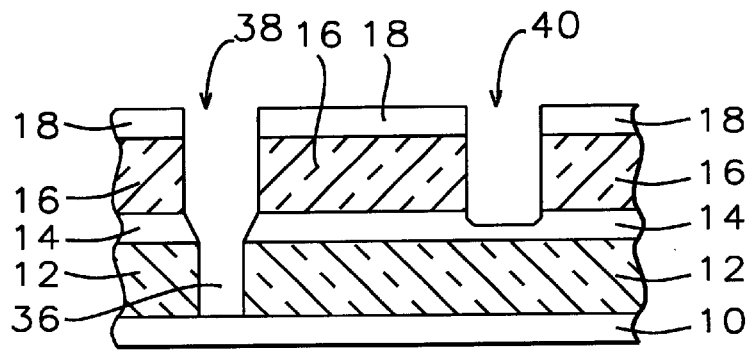
FIG. 4 shows a cross section of the deposited layers after the second etch.

FIG. 4 shows a cross section of the deposited layers after the second etch. This second etch makes use of the high etch selectivity of oxide (of the first layer of dielectric 12) as compared with the etch selectivity of the first stop layer 14 of SiN. The etch parameters contain $CF_4$, $CHF_3$, $O_2$, $N_2$, Ar, CO or $C_4F_8$ or any other suitable material and are chosen such that for the second etch the etch selectivity ratio of SiN (of the first stop layer) versus oxide (of the first layer of dielectric) is in excess of about 1:10.

The second etch has the following results:

it drives the via portion 36 of the damascene structure into the first layer of dielectric 12 it establishes the width for the interconnect pattern 38 of the dual damascene structure it creates opening 40 in the second dielectric layer 16, this opening has the width of interconnect line pattern.

It must be pointed out that the invention first defines the via pattern using the second stop layer 18, this definition of the via opening is further emphasized by the function of the first stop layer 14. The function of the second stop layer 18 in defining the CD for the via opening is important since it allows, in combination with the first stop layer 14, better control of the CD for the via opening. The second stop layer serves as the top, borderless stop layer. Because of this, all four layers of the construction of the invention can be deposited in one, uninterrupted sequence as opposed to having to divide this sequence in two whereby, after the first two layers have been deposited and the dual damascene structure has been created in these first two layers, the other two layers have to be superimposed (over the first two layers) and the dual damascene structure must again be created in these top two layers.

Furthermore, because the invention uses the second stop layer to define the via, the invention offers improved photolithographic overlay and etching control since it eliminates problems of misalignment between the layer of interconnect line pattern and the via layer. The via opening and the interconnect pattern are defined simultaneously at the second stop layer. Concerns of misalignment and etch bias between these two profiles are, in so doing, eliminated. This further allows for ease of rework should, for certain subsections of the device, photo-misalignment have occurred.

Figure 5:
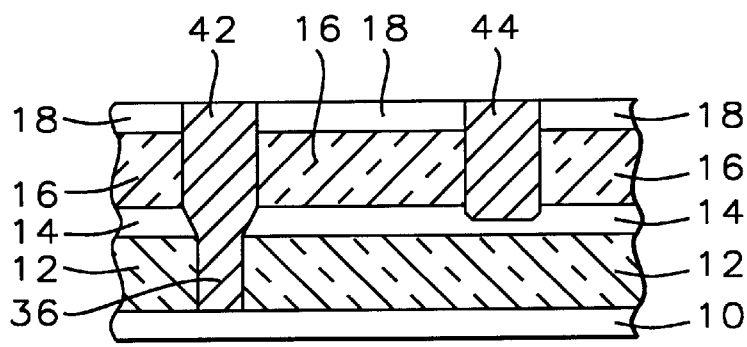
FIG. 5 shows a cross section of the deposited layers after the deposition of a barrier layer and the metal for the damascene structure.

FIG. 5 shows a cross section of the deposited layers after the deposition of a barrier layer and the metal for the damascene structure. The barrier layer (not highlighted) can be deposited over the sidewalls of the damascene structure and can use the previously listed materials for this, most notably Ti, TiN or TaN or any other suitable material. A conductor such as copper, aluminum, doped polysilicon or tungsten, can be deposited in opening 42 for the dual damascene structure or, in opening 44, for the interconnect wire structure.

Figure 6:
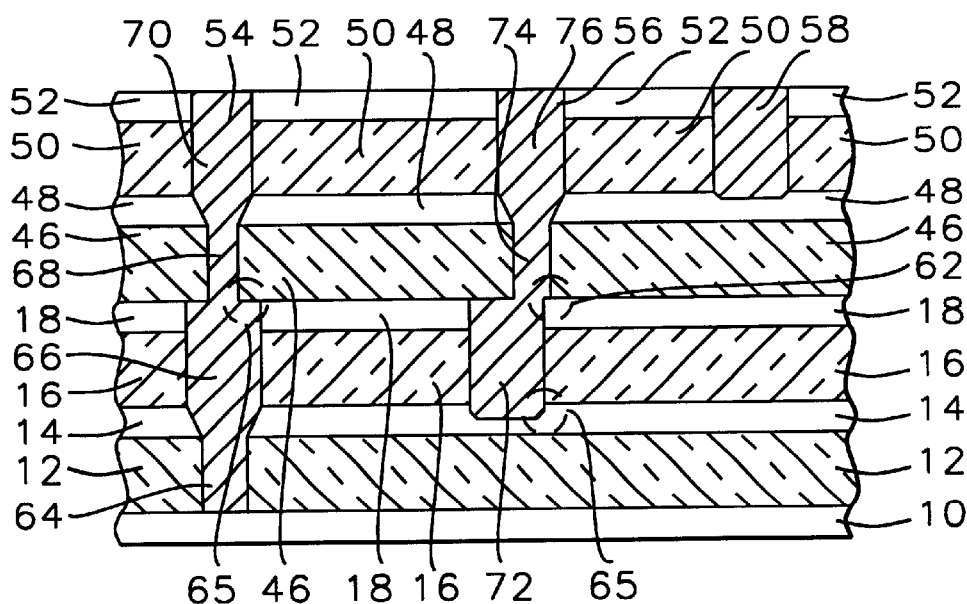
FIG. 6 shows a cross section of a multi-level damascene structure where one structure of the invention has been superimposed over another structure of the invention.

FIG. 6 shows a cross section of a damascene structure where one structure of the invention has been superimposed over another structure of the invention. The lower section is this structure, consisting of layers 10, 12, 14 and 18 with the openings created in these layers, can be created in the manner previously described. Over these layers has been deposited a new set of layers consisting of a third layer 46 of dielectric, a third stop layer 48, a fourth layer 50 of dielectric and a fourth stop layer 52. The lower portion of the cross section shown in FIG. 6 (up through and including layer 18) is identical to the cross section shown in FIG. 5. The openings that are created in the upper section that is shown in FIG. 6, that is the section consisting of layers 46, 48, 50 and 52, are created following a process that is described above for the creation of openings 38 and 40 in of FIG. 4. These combined and sequential processes lead to creating openings 54, 56 and 58 as shown in FIG. 6.

The lower section of the cross section shown in FIG. 6, that is the section consisting of the layers 12, 14, 16 and 18, shows an example of the simultaneous creation of via opening 64 and the overlying interconnect line 66. Also shown in the lower section is the formation of the pattern 72 of interconnect lines.

The upper section of the cross section shown in FIG. 6, that is the section consisting of the layers 46, 48, 50 and 52, shows two examples of the simultaneous creation of via and the overlying interconnect lines, that is 68 with 70 and 74 with 76. The upper section further has an example of the formation of the pattern 58 of interconnect lines.

The combined upper and lower section further shows an example of how an overlying dual damascene structure 54 (consisting of the interconnect line pattern 70 and the via pattern 68) can be in contact with an underlying dual damascene structure (consisting of interconnect line pattern 66 and the via pattern 64).

The combined upper and lower section further also shows an example of how a dual damascene structure 56 (consisting of the interconnect line pattern 76 and the via pattern 74) can be in contact with an underlying interconnect line pattern 72.

Noteworthy in FIG. 6 are the following points:

area 60 shows a borderless via area 62 shows a borderless via where no loss of oxide has occurred around the edge of the metal line 72 area 64 shows a profile of interconnect line 72 with a line depth that can readily be controlled.

It must be pointed out that, inherent in the invention, there is no limitation on how many times the process of creating interconnect line patterns and vias or contact openings can be replicated. It is therefore easy to either draw or imagine a cross section with these features incorporated according to the invention that includes many layers of dielectric interspersed with stop layers. Where design limitations occur, these limitations are imposed due to traditional and well known electrical performance requirements or characteristics such as propagation delay, resistive-capacitive coupling, parasitic capacitance, line resistance and others. The invention provides for the construction of as many layers of interconnect wiring with their contact points and vias as are allowed by the electrical performance requirements and characteristics of the media used to create these structures.

Although the present invention is illustrated and described herein as embodied in the construction of a damascene and borderless via structure, it is nevertheless not intended to be limited to the details as presented. Rather, various modifications may be made in the details within the scope and range of equivalents of the claims and without departing from the spirit of the invention.

What is claimed is:

1. A method of forming a damascene structure over a semiconductor surface, comprising the steps of:

providing a semiconductor substrate, the substrate having been provided with points of electrical interconnect in or on the surface thereof;

depositing a first layer of dielectric over the surface of the substrate;

depositing a first etch stop layer over the surface of the first layer of dielectric;

depositing a second layer of dielectric over the surface of said first etch stop layer;

depositing a second etch stop layer over the surface of the second layer of dielectric;

patterning and etching said second etch stop layer, creating a via pattern having a via width through said second etch stop layer;

patterning and etching a layer of etch resistant material over the surface of said second etch stop layer, creating an opening in said layer of etch stop material that aligns with said via pattern having an interconnect line width, further creating al least one opening having an interconnect line width in said layer of etch resistant material that does not align with said via pattern;

performing a first etch, said first etch extending said width of said via pattern created in said second etch stop layer to a width of a interconnect line pattern, said first etch etching said via pattern created in said second etch stop layer through said second layer of dielectric, through said first etch stop layer and partially into said first layer of dielectric, said first etch further etching said second etch stop layer in accordance with said at least one opening created in said etch resistant material that does not align with said via pattern; and performing a second etch, said second etch further etching said via partially etched into said first layer of dielectric through said first layer of dielectric down to the surface of said substrate, said second etch further etching said interconnect line pattern through said second layer of dielectric and partially through said first etch stop layer, completing the creation of said damascene structure, said second etch further etching said second layer of dielectric in accordance with said at least one opening created in said etch resistant material that does not align with said via pattern.

2. The method of claim 1, said first layer of dielectric comprising oxide, deposited to a thickness between about 6000 and 12000 Angstroms, deposited by applying PECVD, HDPCVD or LPCVD processes.

3. The method of claim 1, said first stop layer comprising SiN or SiON, deposited to a thickness between about 500 and 1500 Angstroms, deposited by applying PECVD, HDPCVD or LPCVD processes.

4. The method of claim 1, said first stop layer comprising SiN or SiON, deposited to a thickness between about 500 and 1500 Angstroms, deposited by applying PECVD, HDPCVD or LPCVD processes.

5. The method of claim 1, said second layer of dielectric comprising oxide, deposited to a thickness between about 4000 and 8000 Angstroms, deposited by applying PECVD, HDPCVD or LPCVD processes.

6. The method of claim 1, said second stop layer comprising SiN or SiON, deposited to a thickness between about 1500 and 2500 Angstroms, deposited by applying PECVD, HDPCVD or LPCVD processes.

7. The method of claim 1 wherein a ratio of etch selectivity between said second stop layer and said second layer of dielectric is about 1:6.

8. The method of claim 1 whereby said first etch applies an etchant gas containing an element selected from the group comprising $CF_4$, $CHF_3$, $O_2$, $N_2$, Ar, CO and $C_4F_8$.

9. The method of claim 1 wherein a ratio of etch selectivity between said first stop layer and said first layer of dielectric is about 1:10.

10. The method of claim 1 whereby said second etch applies an etchant gas containing an element selected from the group comprising $CF_4$, $CHF_3$, $O_2$, $N_2$, Ar, CO and $C_4F_8$.

11. The method of claim 1 with additional steps of:

depositing a layer of barrier material over the surface of said second etch stop layer, including inside surfaces of said via extended through said first layer of dielectric and said interconnect line pattern extended through said second layer of dielectric and partially through said first etch stop layer;

depositing a layer of metal over the surface of said barrier layer; and removing excess metal and said layer of barrier material from the surface of said second etch stop layer.

12. The method of claim 11 wherein said depositing a barrier layer is depositing a layer of Ti or TiN or TaN.

13. The method of claim 11 wherein said layer of metal comprises aluminum or copper or tungsten.

14. The method of claim 1 wherein said layer of etch resistant material comprises photoresist.

15. A method of forming multi-level coplanar conductor and insulator films on a substrate, said substrate having a conductor pattern, comprising the steps of:

providing a substrate, said substrate having metalization in or on the surface thereof;

depositing a multiplicity of dielectric layers over the surface of said substrate, said multiplicity of dielectric layers comprising a first sub-set of dielectric layers in addition to a second sub-set of dielectric layers, said first sub-set of said multiple dielectric layers being deposited over the surface of said substrate, said second sub-set of said dielectric layers being deposited over the surface of said first sub-set of dielectric layers, said second sub-set of dielectric layers comprising an upper dielectric layer, said upper dielectric layer exposing the surface of said second sub-set of dielectric layers;

defining and etching a via pattern through said upper dielectric layer of said multiplicity of dielectric layers;

performing a first etch of said multiplicity of dielectric layers, said first etch etching said via pattern defined in said upper dielectric layer through said second sub-set of said multiple dielectric layers and partially into a bottom layer of said first sub-set of said multiple dielectric layers, said first etch further converting said via pattern in said upper layer of said second sub-set of dielectric layers into an interconnect line pattern in said upper dielectric layer of said multiplicity of dielectric layers;

performing a second etch of said multiplicity of dielectric layers, said second etch further etching said via pattern etched through said second sub-set of said multiple dielectric layers and partially into said first sub-set of said multiple dielectric layers through said first sub-set of said multiple dielectric layers, creating a via opening through said first sub-set of said multiple dielectric layers, said second etch further etching said interconnect line pattern in said upper dielectric of said multiplicity of dielectric layers through said second sub-set of said multiplicity of dielectric layers, creating an interconnect line pattern opening through said second sub-set of said multiplicity of dielectric layers;

depositing a barrier layer over said via opening and said interconnect line pattern opening, including the surface of said upper layer of dielectric;

depositing a layer of metal over said barrier layer; and removing excess metal from the surface of said upper layer of dielectric.

16. The method of claim 15 wherein said depositing a multiplicity of dielectric layers is depositing:

(a) said first sub-set of said multiple dielectric layers, comprising:

(i) a first layer of dielectric deposited over the surface of said substrate; and a first stop layer over deposited over the surface of said first layer of dielectric;

(b) said second sub-set of said multiple dielectric layers, comprising:

(i) a second layer of dielectric over the surface of said first stop layer; and (ii) a second stop layer over the surface of said second layer of dielectric, said second etch stop layer being said upper dielectric layer of said second sub-set of said multiplicity of dielectric layers.

17. The method of claim 16 wherein said first layer of dielectric comprises oxide, deposited to a thickness between about 6 and 12 Kangstroms, using PECVD, HDPCVD or LPCVD processes.

18. The method of claim 16 wherein said first stop layer comprises SiN or SiON, deposited to a thickness between about 500 and 1500 Angstroms, using PECVD, HDPCVD or LPCVD processes.

19. The method of claim 16 wherein said second layer of dielectric comprises oxide, deposited to a thickness between about 4 and 8 Kangstroms, using PECVD, HDPCVD or LPCVD processes.

20. The method of claim 16 wherein said second stop layer comprises SiN or SiON, deposited to a thickness between about 1500 and 2500 Angstroms, using PECVD, HDPCVD or LPCVD processes.

21. The method of claim 16 wherein said first etch has a ratio of etch selectivity between said second stop layer and said second layer of dielectric of about 1:6.

22. The method of claim 16 wherein said second etch has a ratio of etch selectivity between said first stop layer and said first layer of dielectric of about 1:10.

23. The method of claim 15 wherein said performing a first etch of said multiplicity of dielectric layers is:

depositing a layer of photoresist over the surface of said multiplicity of dielectric layers, including said via pattern defined and etched through said upper dielectric of said second sub-set of said multiplicity of dielectric layers;

patterning and developing said layer of photoresist, creating an interconnect line pattern in said photoresist layer, said interconnect line pattern being aligned with said via pattern in said upper dielectric layer, additional interconnect lines being patterned in said photoresist layer not being aligned with said via pattern in said upper dielectric layer;

first etching said second sub-set of dielectric layer in accordance with said interconnect line pattern developed in said layer of photoresist, said etch removing said upper dielectric layer to a width equal to a width of said interconnect line pattern, said first etching further etching said via pattern through said second sub-set of said dielectric layers and partially into said first sub-set of said multiple dielectric layers, said first etching further etching said upper dielectric layer in accordance with said additional interconnect lines patterned in said photoresist layer not being aligned with said via pattern in said upper dielectric layer.

24. The method of claim 16, wherein said first etch has a ratio of etch selectivity between said second stop layer and said second layer of dielectric of about 1:6.

25. The method of claim 15 wherein said performing a second etch of said multiplicity of dielectric layers is etching said interconnect line pattern through said second sub-set of said dielectric layers, said second etch furthermore etching said via pattern through said first sub-set of dielectric layers down to said conductor pattern in or on the surface of said substrate, said second etch further etching said second sub-set of dielectric layers in accordance with said additional interconnect lines etched in said upper dielectric layer.

26. The method of claim 16, wherein said second etch has a ratio of etch selectivity between said first stop layer and said first layer of dielectric of about 1:10.

27. The method of claim 15 wherein said depositing a barrier layer is depositing a layer of Ti or TiN or TaN.

28. The method of claim 15 wherein said layer of metal contains alumuinum or copper or tungsten.

* * * * *